(12) United States Patent  
Kong

(10) Patent No.: US 6,444,576 B1
(45) Date of Patent: Sep. 3, 2002

(54) THREE DIMENSIONAL IC PACKAGE MODULE

(75) Inventor: Sik On Kong, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 47 days.

(21) Appl. No.: 09/595,060

(22) Filed: Jun. 16, 2000

(51) Int. Cl.7 ................................................ H01L 23/02
(52) U.S. Cl. ..................... 438/667; 438/612; 438/614; 438/106; 438/109; 438/613; 257/686
(58) Field of Search ................................ 438/613, 614, 438/612, 109, 667, 106; 257/686, 258

(56) References Cited

U.S. PATENT DOCUMENTS

| | | | |
|---|---|---|---|
| 5,347,428 A | 9/1994 | Carson et al. | 361/760 |
| 5,432,999 A | 7/1995 | Capps et al. | 29/830 |
| 5,682,062 A | * 10/1997 | Gaul | 257/686 |
| 5,737,192 A | 4/1998 | Linderman | 361/790 |
| 5,777,345 A | 7/1998 | Loder et al. | 257/777 |
| 5,838,060 A | 11/1998 | Comer | 257/685 |

* cited by examiner

*Primary Examiner*—David Nelms
*Assistant Examiner*—Thao P Le
(74) *Attorney, Agent, or Firm*—George O. Saile; Rosemary L. S. Pike

(57) ABSTRACT

In the present invention a high performance package is described where semiconductor chips are stacked together in a pancake like fashion with inter chip communications facilitated by chip to chip vias formed through the material of each chip. The chip to chip vias are created by etching and filling a hole from the back of a chip through the silicon substrate stopping at the first level of metalization and invoking the wiring of the chip to complete the path to the top side. The chip in the stack are aligned so that chip to chip vias form columns. Signal and power can travel the full length of a column from the bottom chip to the chip on top, or the wiring within the chips can interrupt the signal flow and form interstitial connections. Interstitial connections can also be used to enhance the wireability between chips in the stack. To accommodate cooling the chips in the stack are made in varying sizes and are ordered in size from the largest at the bottom of the stack to the smallest at the top of the stack. This provides a stair case like structure to allow heat sinks to be attached to each step formed by a chip and the smaller chip above. An interface substrate sits at the bottom of the stack and provides for communication external to the stack by connecting the columns of chip to chip vias to an array of pins to mate with a connector. The short distances that signals must travel lends this three dimensional stacked chip package to high performance for off chip communications.

4 Claims, 5 Drawing Sheets

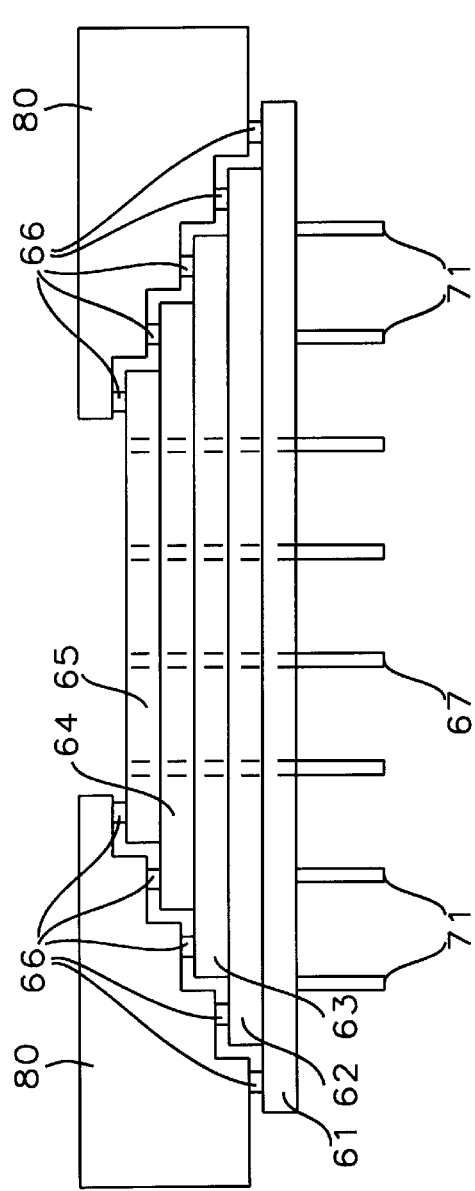
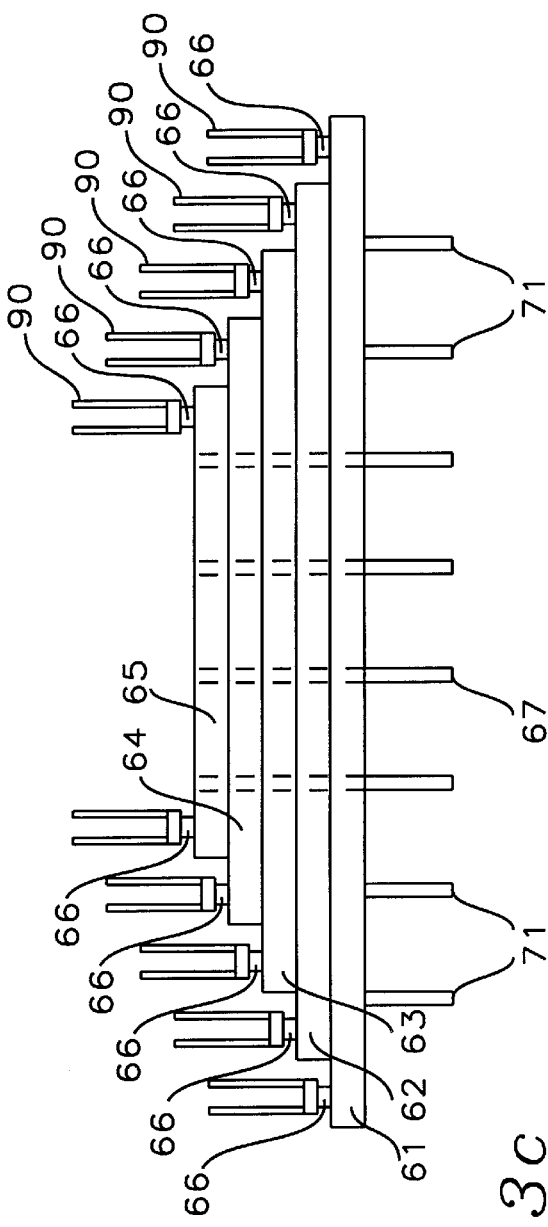
FIG. 3b
FIG. 3c

THREE DIMENSIONAL IC PACKAGE MODULE

BACKGROUND OF THE INVENTION

1. Field of Invention

The present invention relates to integrated circuit packaging and in particular to high performance packaging of integrated circuit chips in a three dimensional package.

2. Description of Related Art

Conventional packaging of integrated circuit chips is in individual packages which are in turn mounted in a planar fashion on a printed circuit board. Often the printed circuit board is in the form of a card which is plugged into a mother board which has other cards mounted in a vertical orientation stemming from an edge connector on the card. To communicate between chips a signal is passed through the signal I/O of the chip, then the signal I/O of the module on which the chip is mounted, through the wiring of a card if one exists, across the wiring of the mother board and back through another card, through the another module and onto another chip. Each time there is a package change, there is some form of a connector which limits the bandwidth and frequency at which the chip to chip communications can be performed. The printed circuit wiring of the modules, cards and board produces delays including perturbations caused by parasitic impedance that limits performance. These delays and perturbations limit the performance of the signals outside the semiconductor chips and in turn limit the performance of the system in which the chips operate.

In U.S. Pat. No. 5,838,060 (Comer) a stacked printed circuit package is shown in which each printed circuit card in the package contains one integrated circuit chip connected to a set of peripherally located I/O terminals. The configuration allows a very tight stacking of printed circuit cards both in a vertical and a horizontal direction. In U.S. Pat. No. 5,777,345 (Loder et al.) an electronic package has a plurality of physically stacked integrated circuit die. Within the package a first die is mounted with leads connected to bond pads. Then a second die is physically mounted on top of the first die and electronically connected to the first die by connecting its leads to the bond pads of the package. In U.S. Pat. No. 5,737,192 (Linderman) a stack of chips are vertically mounted in a well etched in a substrate with a patterned overlay to provide signal connections to each of the stacked chips. In U.S. Pat. No. 5,682,062 (Gaul) shows a stacked set of semiconductor dies with interconnections formed from etched holes filled with a metal starting at the front and extending to the back side of the die. Conductive material in the form of prongs extending from the etched holes of a first die are used to mate with holes of a second die that receive the prongs and form a conductive path from the first die to the second die. In U.S. Pat. No. 5,432,999 (Capps et al.) a process is described for forming a stackable integrated circuit die that can be stacked with other similar die. The integrated circuit die is formed by first forming the posts that are the conductive vias which go through the die and then forming the semiconductor material around posts upon which the integrated circuit is created. In U.S. Pat. No. 5,347,428 (Carson et al.) either a vertical or a horizontal stack of memory chip mounted on a processor chip is described. The signal from the stack of chips is brought out to the edge of each memory chip from where they can be connected to bond pads and then to the processor chip.

An electronic package performs four primary functions: hold, interconnect, power and cool the semiconductor chips that the package was designed to accommodate. Conventional packaging today performs these four basic functions, but at the limitation of performance because the chips are physically and electrically separated by several different package levels and long signal wires. The electrical discontinuities at the transition from one package level to another adds delay caused by parasitic impedance of the package interfaces to an already long wiring delay. At the speed of today's chips this delay external to the semiconductor chips limits the packaged performance below that which could otherwise be attained if everything could be contained within semiconductor chips or within short distances and having a minimum number of package boundaries for signals to traverse.

A three dimensional package, containing a stack of semiconductor chips on an external interface substrate with wiring between chips going through the stack of chips in such a way as to form chip to chip vias, produces a package that has the opportunity to minimize the delay between chips. If the chip to chip vias can be limited to just those chips that need to communicate by forming interstitial chip to chip vias, then the particular column location of the chip to chip via can be used for more than one chip interconnect and the parasitic impedance of the interconnect can be held to a minimum. This can enhance both wireability and performance between chips. In addition to providing tight physical packaging of semiconductor chips, a three dimensional package need to accommodate a means of cooling the package. If a cooling capability can be integrated into the tight stacking of chips, then a complete package can be produce to support numerous high performance needs.

SUMMARY OF THE INVENTION

In the present invention a three dimensional package is described in which semiconductor chips are stacked front to back and to an I/O interface substrate in a pancake like configuration. The I/O interface substrate sits at the bottom of the stack and provides for power and signal connections from external to the stack of chips through a pin array on the side opposite to where connections are made to the chip stack. An array of columns of chip to chip (CTC) vias is created going through each semiconductor chip in the stack to carry power and signal from the I/O interface substrate to the chips in the stack. Signal communications between chips in the stack also use the CTC vias. Segments of the CTC vias within each chip are capped with solder bumps on both the top and bottom sides of each chip. The I/O substrate has an array of solder bumps which are connected to the array of I/O pins and that match the array on the back side of the bottom chip in the stack of chips. The solder bumps on the chip stack and the I/O substrate are aligned, and the stack and substrate are clamped together and heated to reflow the solder bumps. This makes both a physical and an electrical connection between the chips in the stack and the I/O interface substrate.

A segment of the array of CTC vias is formed in each chip by etching holes into the back side of the semiconductor chips until the field oxide layer under the first level of metalization is reached. Then the holes are etched through the field oxide to a metal land in the first level of metal on the top side of the chip. An oxide insulating layer is formed on the walls of the holes, and each hole is filled with a metal and capped with an solder bump. Holes on the top side of the chip located over the holes on the backside are opened in the inter metal dielectric. These holes on the top side are opened to the second level of metal inside the chip and are capped with a solder bump. An interlevel via between the first and second levels of metalization within the chip completes the CTC via segment and provides electrical continuity between the solder bumps on the back of the chip and the solder bumps on the front side of the chip.

The interlevel via between first and second levels of metalization within the chip plays an important role in the forming of the array of CTC vias. When the interlevel via is connected between the first and second levels of metalization, the CTC via is continuous through the chip and signals appearing at a solder bump on the back side of a chip also appear at a solder bump on the top side of a chip. When the interlevel via is not present, the CTC via is open allowing the column in which the open CTC exists to have interstitial connections where the column can support signals of more than one function at the same time. When a CTC vias is open, a signal for one function can enter the chip through a first part of the open CTC via and a second signal for a different function can be sent from the chip through the second part of the open CTC. Thus formed, the interstitial CTC vias can allow different functions to use the same column location, reducing the need for more CTC via holes on the stacked chips and enhancing the wireability between the stack of chips. Using the wiring levels internal to the stacked chip and the ability to open a CTC via stack by leaving out the interlevel via, different interstitial vias in different CTC via stacks can be electrically connected to further enhance wireability between chips in the stack. The internal wiring of the stacked chips can tie together multiple CTC via stacks as might be desired when distributing power, or the internal wiring in conjunction with the interlevel vias might be used to broadcast a signal to multiple CTC via stacks or to multiple interstitial vias such as might be desired with a clock signal.

To accommodate cooling each chip in the stack is made of different size. Starting with the bottom chip and progressing to the top chip, each successive chip is made smaller than the chip directly below it, but larger than the active area of the chip including the CTC via area. When the chips are stacked together they look like steps in a stair case when viewed edge on. The size differences in the chips and the location of the active area within the chips can create a stepped arrangement on any combinations of the four sides of the chips including all four sides. Solder bumps are deposited on each chip in the area of the steps of the "stair case" which extending out beyond the chip mounted above it. One or more heat sinks are attached to the stack of chips by means of the soldering the heat sinks to the solder bumps in the stepped area. Depending on the cooling requirements, one or more heat sinks can be attached to the steps of the chips. If no heat sinking capability is required, the chips in a stack can all be the same size with no stair case like configuration.

BRIEF DESCRIPTION OF THE DRAWINGS

This invention will be described with reference to the accompanying drawings, wherein:

FIGS. 3a–3c show the attachment of heat sinks to the stack of semiconductor chips.

DETAILED DESCRIPTION OF THE PREFERRED EMBODIMENT

Figure 1A:
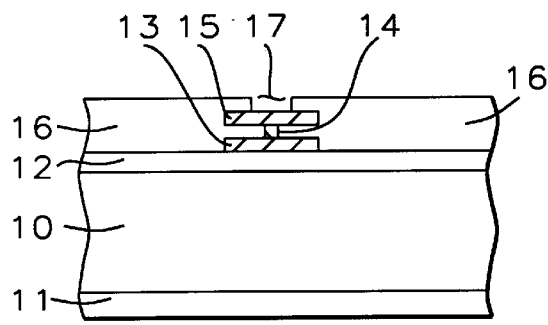
FIGS. 1a–1g are cross section views of the method to produce a chip to chip via.

In FIG. 1a is shown a semiconductor substrate 10 with about 3 $\mu$m and between about 2 and 4 $\mu$m of oxide 11 deposited on the back side of the substrate 10 using a plasma enhanced chemical vapor deposition (PECVD) process. On the top side of the substrate 10 is a field oxide region 12 upon which rests a metal land 13 included in the first level of wiring on the substrate 10. A metal land 15 included in the second level of wiring is connected to the metal land 13 in the first level of wiring by a metal via 14. A hole 17 is opened to the second level metal land 15 through the inter metal dielectric 16 that overlays the wiring metalization 13 14 15 and the substrate 10.

Figure 1B:
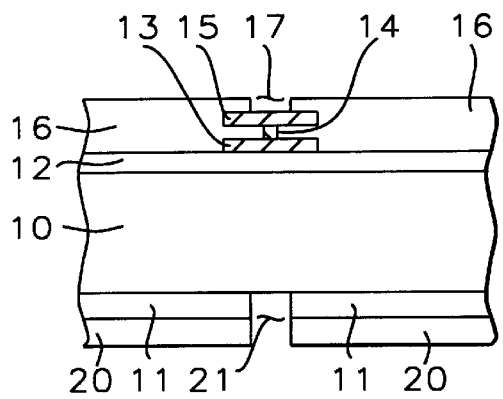
Figure 1C:
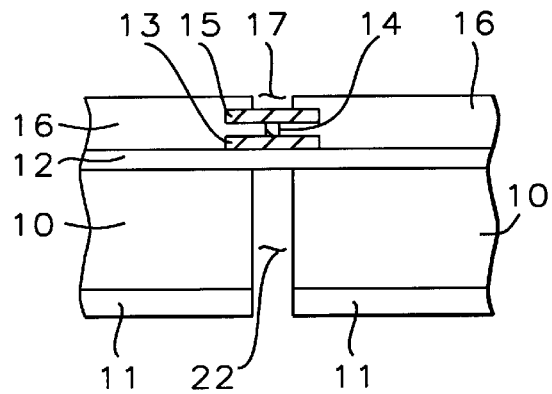

In FIG. 1b a coating of photo resist 20 is applied to the bottom surface of the substrate 10 and a pattern is applied. One or more holes 21 are etched through the oxide layer 11, aligned with a hole pattern of one or more holes 17 on the top of the substrate 10. Shown in FIG. 1c, one or more holes 22 are etched through the substrate 10 using the holes in the backside oxide 11 as a mask and stopping at the field oxide (FOX) 12. The etching of the holes 22 through the substrate 10 to the FOX uses a mixture of an inert gas, (Ar, Ne, or Xe) and an active gas ($Cl_2$, $CF_4$, $SF_6$ or $NF_3$) in a nominal ratio approximately about 1:10 (active gas:inert gas) and ranging from approximately about 1:0 to 1:100. A nominal gas pressure of approximately about 0.1 Pascal is maintained with a range of from approximately about 0.01 Pascal to 1.0 Pascal. The flow rate of the gases has a nominal value of approximately about 100 SCCM within a range of approximately about 10 SCCM to 500 SCCM. The nominal etching selectivity of the gas is approximately about 30 with a minimum value of approximately about 15 and a maximum value of approximately about 1000. The low pressure and the physical bombardment of the back side of the wafer with ionized reactive gas etches the bottom of the holes 22 and at the same time maintain the integrity of the walls of the holes. Maintaining the anisotropy of the etch and removal of any polymer material formed after the etch is important to the forming of the holes 22 from the back of the wafer 11 to the FOX 12. The etching of the holes 22 is stopped at the FOX 12 by either a timed etch or detecting a diminished Si signal using an optical end point detector.

Figure 1D:
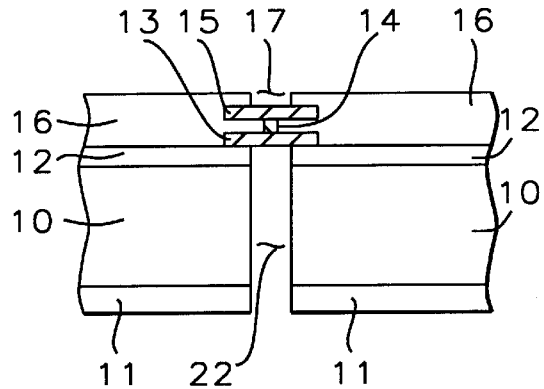

In FIG. 1d the bottom of holes 22 on the backside of the substrate 10 is etched through the FOX 12, stopping at the metal land 13 in the first level of wiring of the chip formed on the substrate 10. To etch the FOX 12 at the bottom of the holes 22 from the backside of the wafer a mixture of an active and an inert gas is used. The active gas is selected from one of $CF_4$, $C_2F_6$, $C_4F_6$, $CHF_3$, and $CH_2F_2$ with or without the addition of oxygen. The inert gas is Ar, Ne, or Xe. The ratio of active to inert gas is preferred to be approximately about 1:10 and falling in the range of approximately about 1:0 to 1:100. The gas pressure is preferred to be approximately about 1 Pascal and falling within a range of approximately about 0.1 Pascal to 10 Pascal. The flow of the gas mixture through the etching chamber is preferred to be approximately about 100 SCCM and falling into a range of approximately about 10 SCCM to 500 SCCM. The selectivity is preferred to be approximately about 10 and in a range of approximately about 1 to 1000.

Figure 1E:
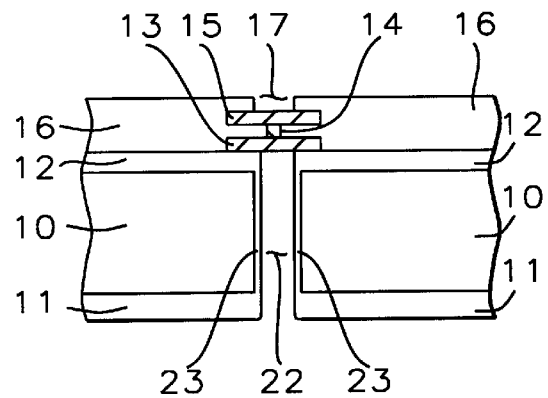

In FIG. 1e the walls of the backside holes 22 are coated with an oxide to form a nominal thickness of approximately about 1 $\mu$m and from between approximately about 0.3 $\mu$m to 10.0 $\mu$m. A plasma enhanced chemical vapor deposition (PECVD) is used to coat the walls of the holes 22 with a continuous and uniform coating using, for instance $SiH_4$+ $O_2$. An anisotropic etch for example a CF4 plasma, is used to remove any oxide that may have been deposited from the first level metal 13 at the bottom of holes 22.

Figure 1F:
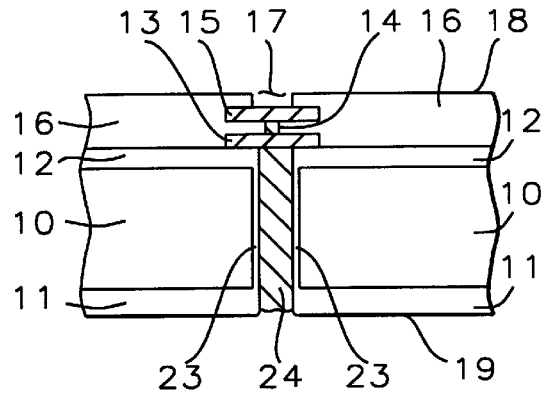
Figure 1G:
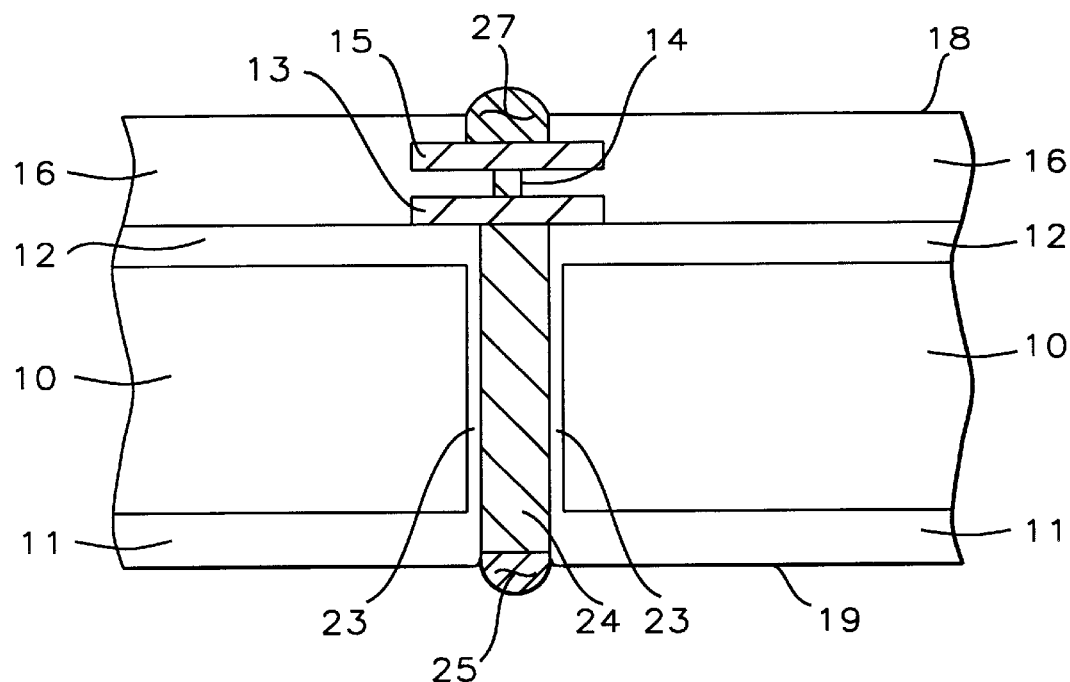

After the walls 23 of the back side holes 22 have been coated with an oxide 23 and the bottom of the hole has been cleaned, a metal deposited 24 into the holes 22 as shown in FIG. 1*f*. The metal deposited into the holes 22 is one of the following, electroless copper, electroless nickel, tungsten by chemical vapor deposition or aluminum by chemical vapor deposition. After metal 24 has been deposited into the holes 22 on the back side 19, the metal is etched back for a preferred time of approximately about ½ hour and in a range from approximately about ten minutes to five hours. The exposed surface of the metal in the holes 22 is coated with a metal to which solder bumps 25, as shown in FIG. 1*g*, can adhere, for instance silver deposited from a silver nitrate dip. On the top side 18 of the substrate 10 the holes 17 that are opened over the holes 22 on the back side 19 have electroless copper and electroless nickel deposited on the surface of the second level of metal 15 prior to a silver nitrate dip to accommodate the depositing of a solder bumps 27. The solder bumps 25 and 27 are deposited using a hot dip process. The chips are dipped into a molten tin/lead solder mixture having, for example, 63% tin and 37% lead. This completes the formation of the CTC via from solder bump 25 deposited on an interface metal connected to the hole fill metallurgy 24 and further connected to a first level metal land 13, through a wiring via 14 to a second level metal land 15 through an interface metal on which is deposited a solder bump 27.

Figure 2A:
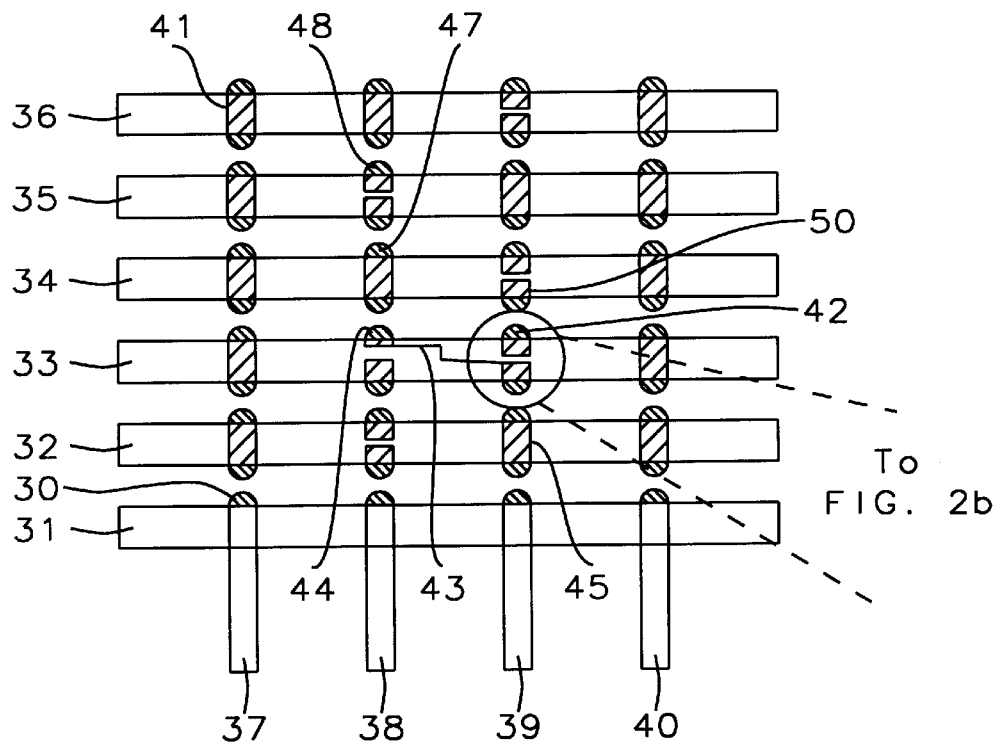
FIGS. 2a–2c are cross section views of the stacking of chips on an I/O substrate.

In FIG. 2*a* is shown a cross section of a substrate 31 aligned with a set of chips 32, 33, 34, 35 and 36 over the substrate. The substrate 31 contains an array of pins that extend out of the bottom of the substrate represented by pins 37, 38, 39 and 40. On the top side of the substrate 31 are a set of solder bumps represented by solder bump 30 attached to pin 37. The solder bumps on the substrate 31 are aligned with the CTC vias contained within the semiconductor chips 32, 33, 34, 35 and 36 and represented by a closed CTC via 41 in chip 36 and open CTC via 42 in chip 33. The closed CTC via 41 is continuous from the bottom solder bump to the top solder bump as shown in FIG. 1*g* with via 14 connecting the second level metal land 15 to the first level metal land 13.

Figure 2B:
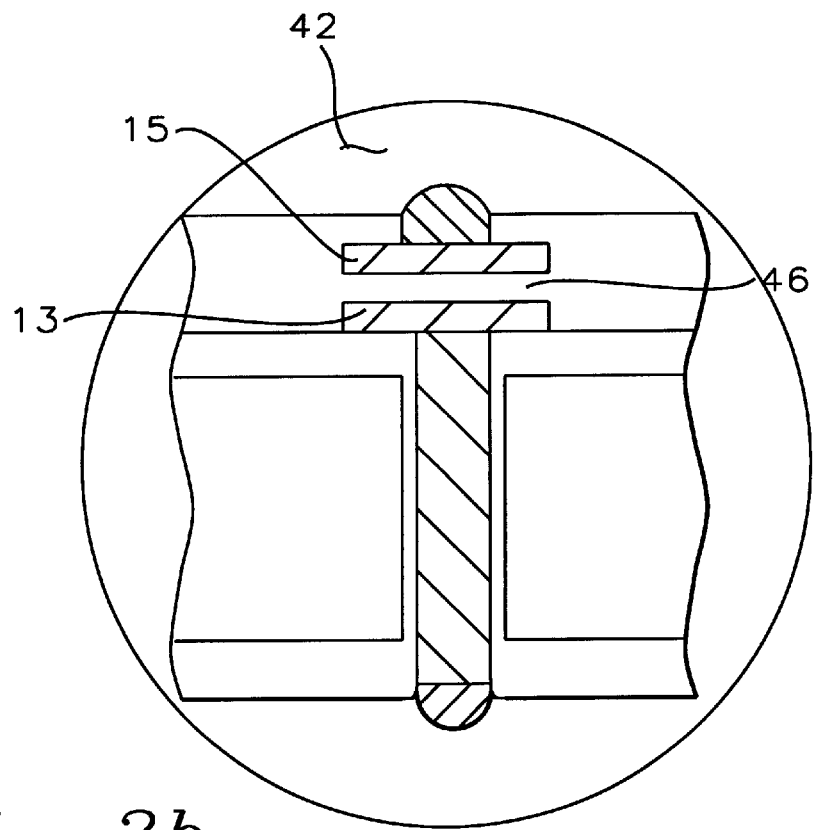

Continuing to refer to FIG. 2*a*, the open CTC via 42 is not continuous as shown in FIG. 2*b* where there is no via 46 between the first level metal land 13 and the second metal land 15. This breaks the continuity in the CTC via stack aligned with pin 39 on the substrate 31 and allows interstitial CTC vias 45 42 and 50 to use the same via column. As an example, the signal on pin 39 can be connected to the wiring in chip 33 through the closed CTC via 45 in chip 32 and the lower connection of the open CTC via 42. The upper connection of open via 42 can be used by chip 33 to make an interstitial connection to chip 34 through the lower connection in open CTC via 50. The signal on pin 39 can then be routed by chip wiring 43 to upper connection of CTC via 44, making a transition between levels of metal along the way from open CTC via 42 to open CTC via 44. The upper connection of the open CTC via 44 will connect the signal on pin 39 to the wiring in chip 35 through the closed CTC via 47 in chip 34 and the lower connection of open CTC via 48 in chip 35.

Figure 2C:
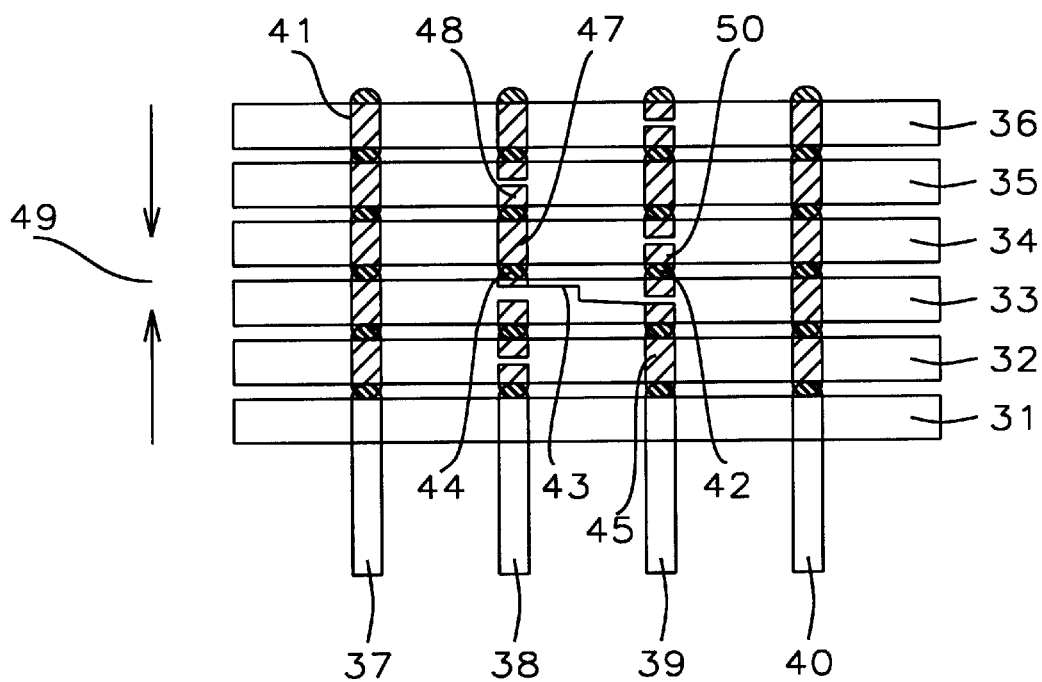

In FIG. 2*c* is shown a cross section of the stack of chips 32, 33, 34, 35 and 36 and the interface substrate 31 after the stack has been pressed together 49 at approximately about ten pounds force and heated to approximately about 330 degrees centigrade for between about 0.1 to 1 minute to reflow the solder bumps on each end of the CTC vias represented by closed CTC via 41 and open CTC via 42. The solder reflow temperature of 330 degrees centigrade is dependent upon the percentage makeup of the tin and lead in the solder bumps. The column of CTC vias connected to pins 37 and 40 are continuous from the substrate 31 and through chips 32, 33, 34, 35 and 36. As an illustrative example, pins 37 and 40 could be power and ground pins, and the continuous connection allows power and ground to be distributed to all chip in the stack. Other pins and CTC vias not shown may also need to be continuous to help distribute power and ground to the chips in the stack. The CTC vias in the columns above pins 38 and 39 are not continuous as shown with CTC vias 42 and 44 and provide interstitial via capability where the same via column is used by several different functions as discussed previously with CTC vias 42, 44, 47, 48 and 50.

Figure 3A:
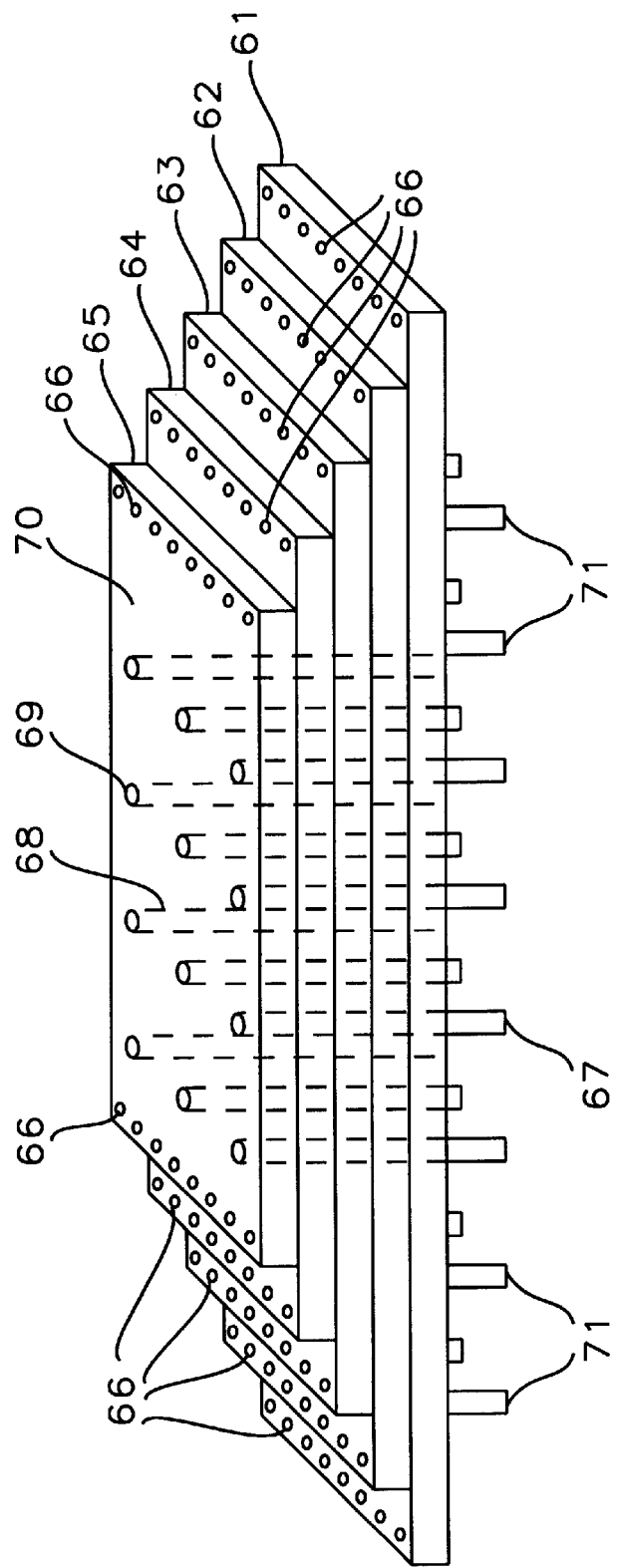

In FIG. 3*a* is shown a stack of semiconductor chips 62, 63, 64 and 65, and an interface substrate 61. The interface substrate 61 and the chips 62, 63, 64 and 65 are each a different size ranging from the substrate being the largest, chip 62 smaller than the substrate 61, chip 63 smaller than chip 62, chip 64 smaller than chip 63, and chip 65 smaller than chip 64. The purpose for this arrangement is to provide a surface on each chip to connect a heat sink. The size of the chips and the interface substrate are shown to vary in size for two opposite sides, but the variation can be with one, two, three or all four sides of the chips and the substrate with a stair case like variation in similar fashion as shown in FIG. 3*a*. On the surface of each step in the stair case like structure is an arrangement of solder bumps 66 including the top chip in the stack 65. The arrangement of solder bumps 66 is shown in a row but other arrangements can be used to accommodate the heat sink design.

Continuing to refer to FIG. 3*a*, an array of pins 67 are shown to extend below the lower surface of the interface substrate 61. Some of the pins are shown connected by dashed lines 68 to the solder bumps 69 on the top surface of the smallest chip 65. The dashed lines 68 represent columns of CTC vias which may be continuous from a solder bump 69 on the top chip 65 to the pin array 67, or may be discontinuous permitting interstitial vias and wiring capability as discussed with FIGS. 2*a*–2*c*. A portion of the pin array 71 is shown outside the shadow of some of the chips in the stack. This serves two purposes, a) to spread the pin array out to accommodate a connector system and b) to provide more signal I/O to accommodate the function of the chip stack. Pins outside the array of CTC via columns are connected to the CTC via columns by means of a redistribution of wiring (not shown) in the substrate 61 or any chip which sits above these pins outside the CTC via columns.

Shown in FIG. 3*b* are two heat sinks 80 connected to the chip stack 62, 63, 64, and 65, and the interface substrate 61 by pressing the heat sinks to the stack with approximately about ten pounds of force and heating the stack and the heat sinks to between about 290 degrees centigrade for between about 0.1 to 1 minute. The solder reflow temperature of 290 degrees centigrade is dependent upon the percentage makeup of the tin and lead in the solder bumps. In FIG. 3*c* is shown a different heat sink configuration 90 that are individually mounted to the interface substrate 61 and each chip 62, 63, 63 and 65 in the stack. The heat sinks in FIG. 3*c* are shown with more than two surfaces to provide additional cooling capability in support of the function contained within the three dimensional integrated circuit package.

While the invention has been particularly shown and described with reference to preferred embodiments thereof, it will be understood by those skilled in the art that various changes in form and details may be made without departing from the spirit and scope of the invention.

What is claimed is:

1. A method to connect pads on front side of a chip to pads on back side of said chip, comprising:
   a) forming multi-levels of metalization over a field oxide on a front side of a silicon substrate with metalized vias connecting levels of metalization and with an inter-metal dielectric (IMD) between and over said metalization.
   b) forming an oxide on backside of said silicon substrate using plasma enhanced chemical vapor deposition (PECVD),
   c) forming a first opening in said IMD on a front side of said silicon substrate to create a first hole over a second level metal land connected by means of a via to a first level metal land on top of said field oxide,
   d) forming a second opening in the oxide on the backside of said wafer opposite said first opening,
   e) etching a second hole from backside of said silicon substrate to said field oxide using oxide on back side of said silicon substrate as a mask.
   f) etching said second hole into said field oxide and stopping at said first level metal land,
   g) depositing an oxide coating on walls of said second hole by means of a PECVD to produce a continuous and uniform coating,
   h) depositing electroless copper or electroless nickel in said second hole to fill said second hole from said first level metal land to said backside of said silicon substrate,
   i) etching back said metal in said second hole,
   j) preparing said first hole and said second hole for a solder bump,
   j) depositing said solder bump onto metalization in said first hole on front side of said silicon substrate using a hot solder dip,
   k) depositing said solder bump onto metalization in said second hole on said backside of said silicon substrate using a hot solder dip.

2. The method of claim 1, wherein forming multiple levels of metalization over a field oxide on the front side of the silicon substrate without a metalized vias connecting between said first and second metal lands creates a capability to form an interstitial chip to chip via to allow communication between chips.

3. The method of claim 1, wherein depositing said oxide coating and performing said plasma etch back produces an oxide wall within said second hole in the silicon substrate that is nominally 1 micrometer thick and between about 0.8 to 1.2 micrometers, and producing a diameter of said second hole between about 10 and 20 micrometers.

4. The method of claim 1, wherein depositing a metal in said second hole is done by chemical vapor deposition of tungsten or chemical vapor deposition of aluminum to fill said second hole from said first level metal land to said backside of said silicon substrate.

* * * * *